United States Patent [19]
Yamamoto

[11] Patent Number: 5,696,398
[45] Date of Patent: Dec. 9, 1997

[54] INPUT PROTECTION CIRCUIT

[75] Inventor: Shigehisa Yamamoto, Itami, Japan

[73] Assignee: Mitsubishi Denki Kabushiki Kaisha, Tokyo, Japan

[21] Appl. No.: 280,972

[22] Filed: Jul. 27, 1994

[30]     Foreign Application Priority Data

Oct. 1, 1993   [JP]   Japan .................. 5-246913

[51] Int. Cl.⁶ ................................................. H01L 23/62
[52] U.S. Cl. .................... 257/362; 257/355; 257/358; 257/360; 257/361; 257/363
[58] Field of Search .................... 257/355, 358, 257/360, 363, 362, 361

[56]         References Cited

U.S. PATENT DOCUMENTS

| 4,928,157 | 5/1990 | Matsunaga et al. | 257/362 |
| 5,087,955 | 2/1992 | Futami | 257/362 |
| 5,304,839 | 4/1994 | Chen et al. | 257/362 |

FOREIGN PATENT DOCUMENTS

| 0 168 678 | 1/1986 | European Pat. Off. . |
| 58-58769 | 4/1983 | Japan . |
| 62-71275 | 4/1987 | Japan . |
| 2242757 | 9/1990 | Japan .................................. 257/363 |

*Primary Examiner*—Mahshid D. Saadat
*Assistant Examiner*—Walencia Martin Wallace
*Attorney, Agent, or Firm*—Lowe, Price, LeBlanc & Becker

[57]         ABSTRACT

An input protection circuit comprises an internal circuit and an input terminal, between which a pair of rectifying devices are interposed with polygonal diffusion regions of one and the other conduction types, which diffusion regions are formed longer along the width thereof orthogonal to the direction of current flow in the wiring than along the direction of current flow. The width of the contacts between said wiring and said diffusion regions is greater than the width of the wiring not having the contacts, thereby achieving a high electrostatic breakdown voltage.

9 Claims, 7 Drawing Sheets

INPUT PROTECTION CIRCUIT

BACKGROUND OF THE INVENTION

1. Field of the Invention

The present invention relates to an input protection circuit for MOS semiconductor integrated circuits.

2. Description of Related Art

A semiconductor integrated circuit having an MOS transistor comprises an input protection circuit inserted between an internal circuit and an input terminal in order to prevent the gate oxide film of the internal circuit from being electrostatically broken by an external surge voltage. FIG. 1 is a circuit diagram showing a conventional input protection circuit described in Japanese Patent Application Laid Open No. 58-58769 (1983). In FIG. 1, numeral 101 designates an input terminal. The surge voltage entering the input terminal 101 is applied to complementary MOS transistors $Q_1$, $Q_2$ making up an internal circuit.

A protective resistor R is connected between the input terminal 101 and the MOS transistors $Q_1$, $Q_2$. The protective resistor R is formed of a polycrystal silicon layer placed through a field oxide film on a semiconductor substrate, or a diffusion layer in the semiconductor substrate, or other devices. Protective diodes $D_1$, $D_2$ are connected in parallel at the connection between the input terminal 101 and the resistor R. The protective diode $D_1$ has the anode thereof connected to the input terminal 101 and the cathode thereof connected to a positive power supply $V_{DD}$. Also, the protective diode $D_2$ has the anode thereof connected to a ground $V_{SS}$ providing a negative power supply and the cathode thereof connected to the input terminal 101.

FIG. 2 is a plan view schematically showing the protective diode $D_1$ in FIG. 1. FIG. 3 is a schematic sectional view taken in the line III—III in FIG. 2. A rectangular high-concentration p-type diffusion region 103 is formed on an n-type semiconductor substrate 102 in plan view. A high-concentration p-type resistance region 105 is formed in contact with the p-type diffusion region 103. A high-concentration n-type diffusion region 104 is formed to make up a PN junction in contact with the periphery of the p-type diffusion region 103. An insulating film 106 is formed on the semiconductor substrate 102, and an electrode 107 is formed in such a manner as to embed the contact hole formed on the p-type diffusion region 103 of the insulating film 106. The protective diode $D_2$ is similar to the protective diode $D_1$ except that the semiconductor substrate, the diffusion regions, etc. are formed in inverse conduction type, and therefore is not explained.

The protective diodes $D_1$, $D_2$ of this structure are such that in the case where a surge voltage is applied to the input terminal 101, the forward operation or the breakdown operation of the protective diodes $D_1$ or $D_2$ causes a current to flow to the power supply $V_{DD}$ or the ground $V_{SS}$, thereby reducing the voltage applied to the MOS transistors $Q_1$, $Q_2$. As a result, the gate oxide film of the MOS transistors $Q_1$, $Q_2$ providing an internal circuit is prevented from being electrostatically broken down.

In recent years, with the increased number of pins and integration of the MOS semiconductor integrated circuits, it has become more difficult to provide a sufficient area for an input protection circuit. The electrostatic breakdown of the protective diode in an input protection circuit is caused mainly by the meltdown of silicon resulting from heat generated through the concentration of the surge current at the PN junction of the diffusion regions. In the case where the diffusion area of the protective diode is small, the concentration of current in the diffusion region is so great that the input protective circuit is electrostatically broken down by a comparatively low surge voltage. It is therefore necessary to secure a sufficient area of the diffusion regions, which in turn increases the area for the input protective circuit, thereby making it impossible to utilize the silicon area effectively.

A configuration of the input protection circuit intended to obviate the above-mentioned problems is proposed in Japanese Patent Applications Laid-Open No. 58-58769 (1983) and No. 62-71275 (1987). In the input protection circuit proposed in Japanese Patent Application Laid-Open No. 58-58769 (1983), a diffusion region in which the surge current is allowed to flow is formed of a high-concentration p-type diffusion region and a low-concentration p-type diffusion region surrounding the high concentration p-type diffusion region, and a high-concentration p-type diffusion region surrounding the low-concentration p-type diffusion region. These diffusion regions have a large layer resistance of the p-type diffusion region, whereby the electrostatic breakdown voltage of the diffusion region is increased. Thus the electrostatic breakdown voltage is improved to the same degree as in the prior art. The production of this input protection circuit, however, requires a multiplicity of patterning processes for forming the diffusion regions, thereby posing the problem of an increased time and labor.

The input protection circuit proposed in Japanese Application Laid-Open No. 62-71275 (1987), on the other hand, comprises a plurality of resistive elements, protective diodes and protective MOS transistors. According to this proposition, the diffusion region for the protective diode is formed deeper than the source-drain region of the internal circuit in order to prevent the junction breakdown in the diffusion region of the protective diode. As a consequence, the gate voltage applied to the internal circuit can be reduced without breaking the protective diodes, thereby preventing the gate oxide film of the internal circuit from being broken down electrostatically. However, the problem remains that the production process for forming a deep diffusion region of the protective diode consumes considerable labor and time.

SUMMARY OF THE INVENTION

The invention has been developed in order to obviate the above-mentioned problems, and the object thereof is to provide an input protection circuit which can be produced with ease and which has a high electrostatic breakdown voltage without an increased area.

According to one aspect of the invention, there is provided an input protection circuit comprising a first rectifying device including a semiconductor layer of one conduction type connected with a power supply of one polarity having a PN junction with the periphery of a first diffusion region, a second rectifying device including a semiconductor layer of the other conduction type connected with a power supply of the other conduction type having a PN junction with the periphery of a second diffusion region, and a wiring formed across the first and second diffusion regions. The first and second diffusion regions have a polygonal shape with a width orthogonal to the direction of the wiring greater than the length in the direction of the wiring on the diffusion regions where the current supplied from the input terminal flows. The contact between said wiring and the first and second diffusion regions has a greater width than the width of the wiring which is not connected with the diffusion regions. Further, the ends along the width of the contact are located equidistantly from the center along the width of the wiring not formed with the contact.

According to another aspect of the invention, there is provided an input protection circuit having the feature that the diffusion regions are rectangular and that the ratio between the long and short sides of the rectangle is between 5/1 and 15/1.

According to still another aspect of the invention, there is provided an input protection circuit, in which an insulating section is interposed between the first and second rectifying devices and the wiring.

As a consequence of the above-mentioned features, in the case where a surge current is supplied from the input terminal, the surge current that has rushed into the rectifying devices is divided along the width of the diffusion regions, and therefore the current concentration which otherwise might occur at the entrance PN junction of the rectifying devices is relaxed. Also, in view of the fact that the width of the contact formed on the diffusion regions is larger than the width of the wiring passing the surge current, the current concentration is balanced between the diffusion regions with the wiring inbetween. Therefore, no current is concentrated at the contact ends which easily succumb to a surge current, thereby improving the electrostatic breakdown voltage. In the case where a surge current flows through the wiring, a higher electrostatic breakdown voltage is obtained with the area of the diffusion regions substantially unchanged. Further, a sufficient electrostatic breakdown voltage is achieved with a small area of the diffusion regions.

The above and further objects and features of the invention will more fully be apparent from the following detailed description with accompanying drawings.

DESCRIPTION OF THE PREFERRED EMBODIMENTS

The invention will be explained in detail below with reference to the accompanying drawings showing embodiments thereof.

Figure 1:
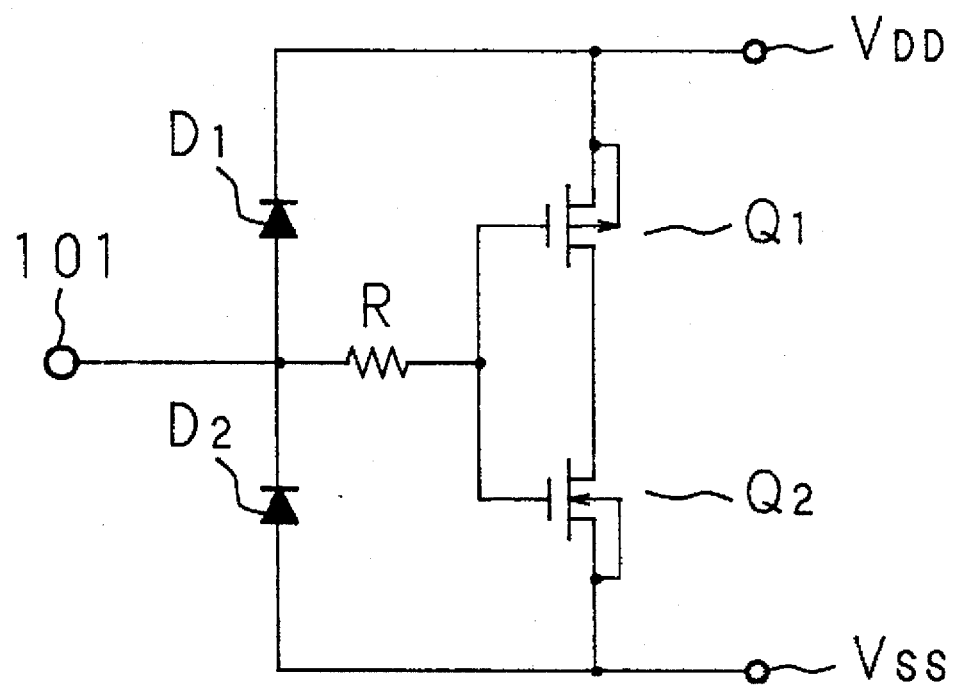
FIG. 1 is a circuit diagram showing a conventional input protection circuit.
Figure 2:
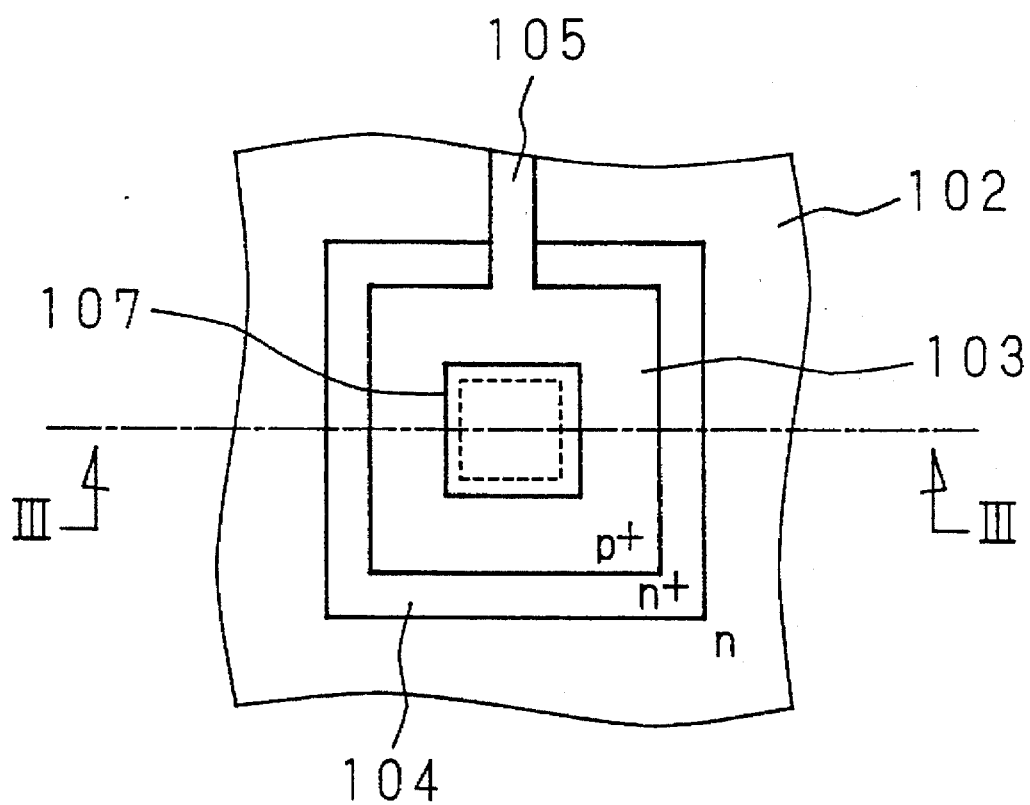
FIG. 2 is a plan view schematically showing a conventional protective diode $D_1$.
Figure 3:
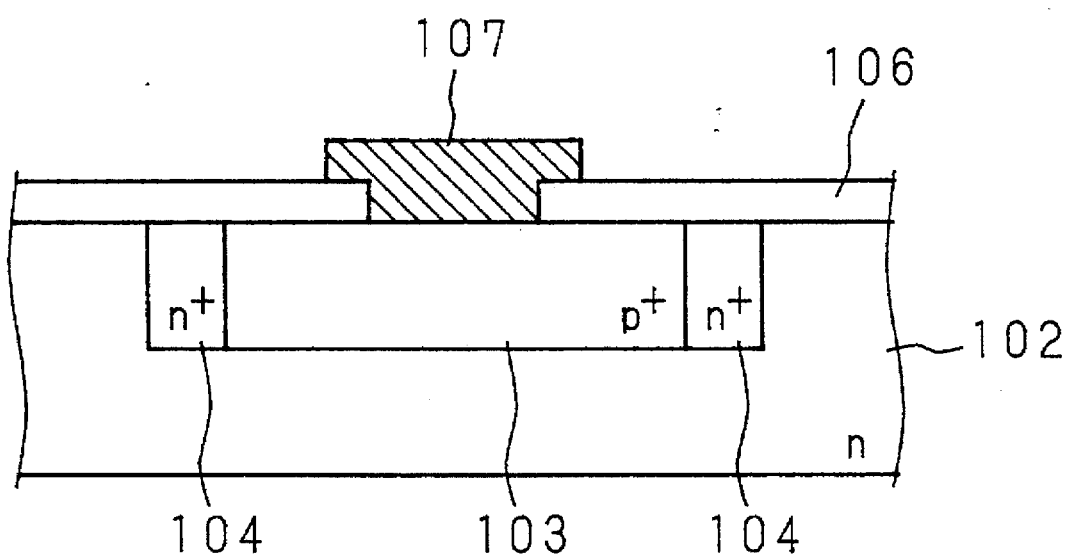
FIG. 3 is a schematic sectional view taken in the line III—III in FIG. 2.
Figure 4:
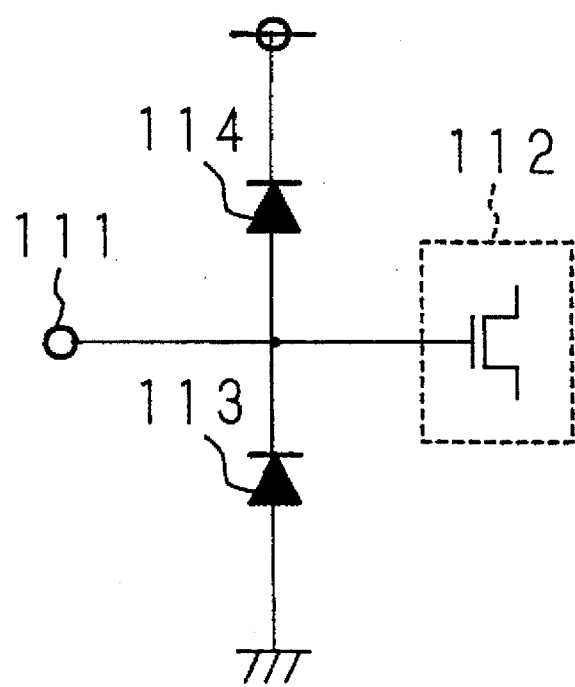
FIG. 4 is a circuit diagram showing an input pro ection circuit according to an embodiment of the invention.

A circuit diagram of an input protection circuit according to the invention is shown in FIG. 4. Numeral 111 designates an input terminal. A surge voltage entering the input terminal 111 is applied to an internal circuit 112. In the connection between the input terminal 111 and the internal circuit 112, a protective diode 113 and a protective diode 114 making up first and second rectifying devices respectively is connected in parallel to each other. The protective diode 114 has the anode thereof connected to the input terminal 111, and the cathode thereof connected to a positive power supply $V_{CC}$. The protective diode 113 has the anode thereof connected to a ground $V_{SS}$ making up a negative power supply, and the cathode thereof connected to the input terminal 111.

Figure 5:
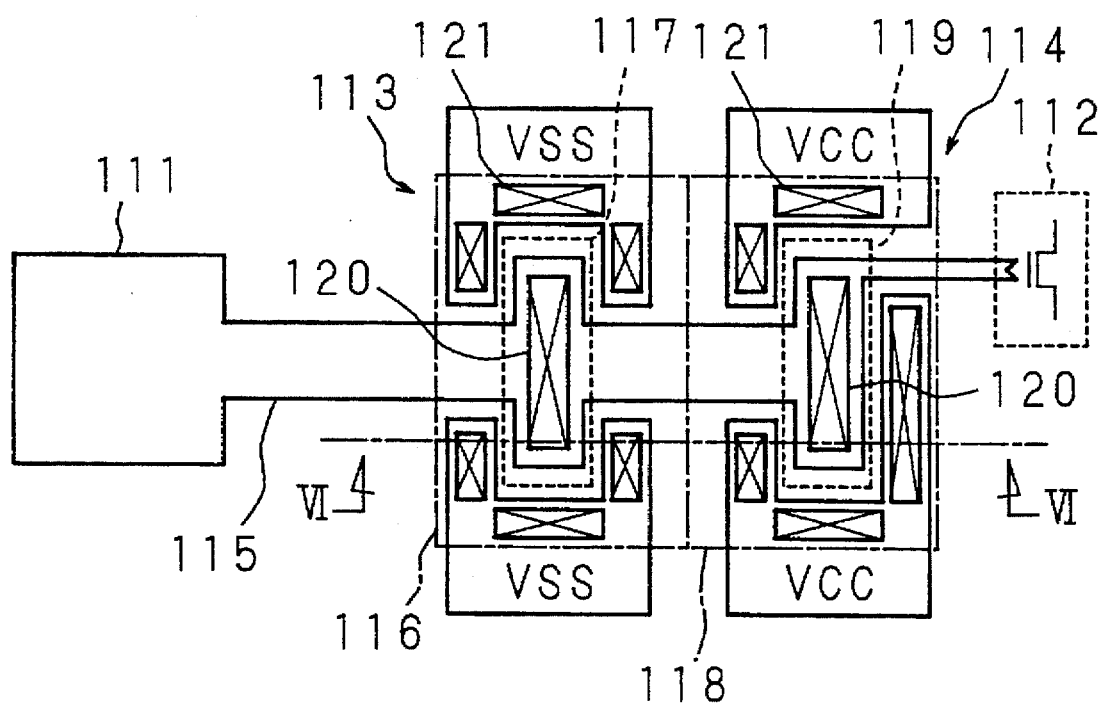
FIG. 5 is a plan view schematically showing a protective diode according to an embodiment of the invention.
Figure 6:
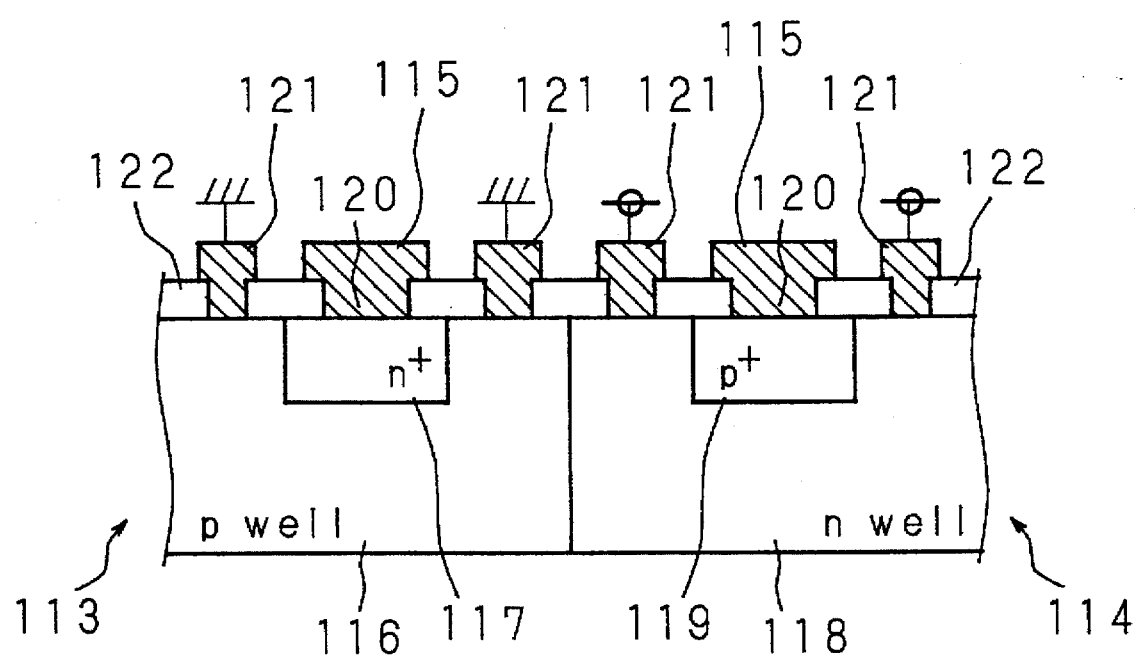
FIG. 6 is a schematic sectional view taken in the line VI—VI in FIG. 5.

A schematic plan view of the protective diodes 113, 114 of FIG. 4 is shown in FIG. 5. A sectional view taken in the line VI—VI of FIG. 5 is illustrated in FIG. 6. A p-type conduction well 116 and an n-type conduction well 118 are formed adjacently. A high-concentration n-type diffusion region 117 is formed by phosphorus doping at substantially the central portion of the p-type conduction well 116, and a high-concentration p-type diffusion region 119 by boron doping at substantially the central portion of the n-type conduction well 118. The n-type diffusion region 117 and the p-type diffusion region 119 exhibit a rectangular shape in plan view respectively. These rectangles have the side thereof parallel to the boundary between the p-type conduction wells 116 and n-type conduction wells 118 longer than the length along the direction perpendicular to the boundary. The ratio between long and short sides of each diffusion region is preferably about between 5:1 and 15:1. In the case where the long side is set extremely long, it is difficult for the surge current to propagate along the long side as described later.

An insulating film 122 is formed on the surface of the semiconductor diffusion layer constructed as described above. The insulating film 122 has an aluminum wiring 115 thereon up to the position reaching the internal circuit 112 from the input terminal 111 through the surfaces of the conduction well 116, the n-type diffusion region 117, the conduction well 118 and the p-type diffusion region 119. The aluminum wiring 115 is formed connecting the position crossing the center on the n-type diffusion region 117 and the position crossing the center on the p-type diffusion region 119 to each other. The width of the aluminum wiring 115 on the n-type diffusion region 117 and the p-type diffusion region 119, i.e., the length along the longitudinal direction of the respective diffusion regions is longer than the width of the aluminum wiring 115 formed on the conduction well 116 and the conduction well 118.

The insulating film 122 on the n-type diffusion region 117 and the p-type diffusion region 119 has contact holes therein, so that the n-type diffusion region 117 and the p-type diffusion region 119 are connected with the aluminum wiring 115 respectively by contacts 120, 120. As shown in FIG. 5, the contacts 120, 120, have a width that is longer than a width of the wiring 115 formed on p-type conduction well 116 and n-type conduction well 118, and shorter than the maximum width of the wiring 115 formed above the first and second diffusion regions 117 and 119. The contacts 120, 120 are formed in the shape of the n-type diffusion region 117 and the p-type diffusion region 119 scaled down by about 2 μm respectively. This is in order to avoid the effect of heat generated in the PN junctions of the protective diodes 113, 114. The scale-down factor for the short sides of the contacts 120, 120 is preferably larger than that for the long sides thereof, whereby the concentration of surge current along the short sides is lowered. In view of the fact that the contact ends, i.e., the longitudinal ends of the contacts 120, 120 are situated equidistantly from the center of the aluminum wiring 115 and outside the edges of the width of the aluminum wiring 115 except for the regions having the contacts, no current is concentrated at the contact ends which easily succumb to surge current.

A ground $V_{SS}$ is formed in opposed relation with and on the sides of the aluminum wiring 115 on the insulating film 122 which is formed on the surface of the conduction well 116. A power supply $V_{CC}$ is formed in the same way on the insulating film 122 which is formed on the surface of the conduction well 118. Contact holes are formed in the insulating film 122, so that the ground $V_{SS}$ and the power supply $V_{CC}$ are connected to the conduction well 116 and the conduction well 118 by the contacts 121, 121, . . . .

Figure 7:
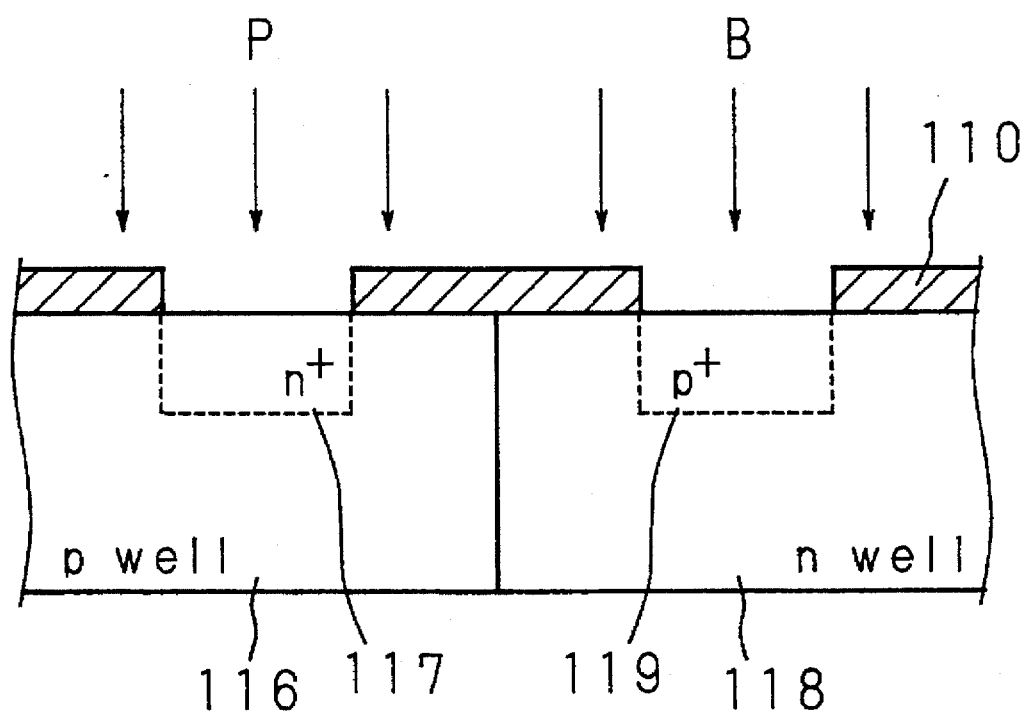
FIG. 7 is a sectional view schematically showing a protective diode in producing processes according to an embodiment of the invention.

The process for producing the protective diodes 113, is now 114 having the above-mentioned structure explained. FIG. 7 is a sectional view schematically showing the protective diodes 113, 114 of FIG. 6 in the producing process. As shown in this diagram, the p-type conduction well 116 and the n-type conduction well 118 are formed adjacently. An insulating film is deposited on the conduction wells 116, 118, and a mask 110 is formed by patterning the insulating film. The p-type conduction well 116 is doped with phosphorus and the n-type conduction well 118 with boron thereby to form the n-type diffusion region 117 and the p-type diffusion region 119 respectively.

Now, as shown in FIG. 6, the mask 110 is removed, and the insulating film 122 is deposited on the conduction wells 116, 118. Contact holes are then formed on the conduction wells 116, 118, the n-type diffusion region 117, and the p-type diffusion region 119 of the insulating film 122. Contacts 120, 120 are formed to connect the aluminum wiring with both the n-type diffusion region 117 and the p-type diffusion region 119. Contacts 121, 121 are formed to connect the ground $V_{SS}$ and the power supply $V_{CC}$ with the conduction wells 116 and 118 respectively.

With the protective diodes 113, 114 thus produced, a surge voltage applied to the input terminal 111 flows through the aluminum wiring 115 and is supplied to the internal circuit 112 through the conduction well 116, the n-type diffusion region 117, the conduction well 118 and the p-type diffusion region 119. In the case where the applied voltage is an excessive positive surge voltage and exceeds the breakdown voltage of the protective diode 113, the protective diode 113 breaks down allowing the current to propagate along the boundary between the n-type diffusion region 117 and the insulating film 122 toward the PN junction between the p-type conduction well 116 and the n-type diffusion region 117, finally reaching the ground $V_{SS}$. The protective diode 114, on the other hand, turns on in the forward direction when the excessive positive surge voltage is higher than the source voltage $V_{CC}$. As a result, the current propagates along the boundary between the p-type diffusion region 119 and the insulating film 122 toward the PN junction between the n-type conduction well 118 and the p-type diffusion region 119, finally reaching the power supply $V_{CC}$.

In the event that the applied voltage is an excessive negative surge voltage, by contrast, the protective diode 113 turns on in the forward direction, and causes the current to flow from the ground $V_{SS}$ to the internal circuit 112, while the protective diode 114 breaks down and causes the current to flow from the $V_{CC}$ to the internal circuit 112.

In this way, the current that flows through the aluminum wiring 115 upon application of a surge current rushes toward the PN junction of the diffusion regions from the contacts 120, 120. In the process, since the plan view of the diffusion regions is a rectangle longer in the direction orthogonal to the aluminum wiring 115, the current density at the PN junction where the surge current has rushed in is decreased, thereby lowering the concentration of the surge current. Also, the ends of the contacts between the aluminum wiring 115 and each diffusion region are located equidistantly from the wiring center and outside the edges of the width of the aluminum wiring 115 except for the regions having the contacts. Therefore, the current is not concentrated, leading to a high resistance to electrostatic breakdown. All these facts contribute to an improved electrostatic breakdown voltage of the protective diodes 113, 114.

An input protection circuit comprising the protective diodes 113, 114 described above has a diffusion region 1000 $\mu m^2$ in area, and an electrostatic breakdown voltage of more than 450 V in a surge test of 200 pF and 0 $\Omega$, which are sufficient values for practical applications. Considering that a diffusion area of from 2500 $\mu m^2$ to 3500 $\mu m^2$ is required of the conventional protective diodes for securing a sufficient breakdown voltage, it is seen that an electrostatic breakdown voltage of the same magnitude as the conventional diodes can be obtained with a very small area. Also, the electrostatic breakdown voltage was less than one half when the width of the contacts is smaller than that of the aluminum wiring with the long and short sides of the diffusion regions inverted in a layout similar to the aforementioned embodiment. As will be seen, an input protection circuit as described above can secure a sufficient electrostatic breakdown voltage with a small area. The voltage applied to the internal circuit 112 can thus be reduced without causing the electrostatic breakdown of the input protection circuit, thereby preventing the electrostatic breakdown of the internal circuit 112.

According to the embodiments of the invention, one contact is formed to connect the wiring and the diffusion region. The invention, however, is not limited to such cases. A plurality of contacts making up similar shape may be formed with equal effect. Also, either one or a plurality of contacts may be formed with equal effect for connecting the diffusion layer through a PN junction with the diffusion regions and the power supply $V_{CC}$ or the ground $V_{SS}$ in such a manner as to surround the diffusion regions. Further, the wiring may be formed in direct contact on the diffusion regions without any insulating film therebetween.

In addition, unlike in the foregoing description of embodiments referring to rectangular diffusion regions, polygonal diffusion regions may be used with equal effect.

Furthermore, apart from the structure in which the first and second rectifying devices are adjacent to each other as according to the above-mentioned embodiments, the invention is not limited to such a structure but any structure in which the two rectifying devices are distant from each other by an appropriate length may be incorporated.

In addition, although the aforementioned embodiments concern the case in which only a protective diode is used for an input protection circuit, the invention is not confined to such a case but, for example, a resistor may be connected between an input terminal and an internal circuit.

Moreover, instead of forming the wiring along the direction parallel to the alignment of the first and second diffusion regions as according to the above-mentioned embodiments, the invention may alternatively be such that the wiring is formed along the direction orthogonal to the alignment of the diffusion regions.

It will thus be understood from the foregoing description that the input protection circuit according to the invention, in which diffusion regions of different conduction types having a pair of rectifying devices are connected to the junction point between the input terminal and the internal circuit, can be easily produced. Further, the diffusion regions have a polygonal shape in plan view which is wider perpendicular to the direction of current flow in the wiring formed across the diffusion regions. Also, the width of the contacts is greater than the width of the wiring except for the regions having the contacts, and the ends along the width of the contacts are located equidistantly from the wiring. As a result, the concentration of current at the PN junction is lowered, thereby leading to the various advantages including an improved electrostatic breakdown voltage without an increased area.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An input protection circuit for protecting an internal circuit from electrostatic breakdown, comprising:

an input terminal supplying current to said internal circuit;

a first rectifying device formed of a semiconductor layer of a first conduction type connected with a power supply of one polarity, said first device having a PN junction with a periphery of a first diffusion region;

a second rectifying device formed of a semiconductor layer of a second conduction type different from the first conduction type connected with a power supply of the other polarity, said second device having a PN junction with a periphery of a second diffusion region;

a wiring formed to cross above said first and second diffusion regions in order to connect said first and second rectifying devices to the junction point between said input terminal and said internal circuit; and contacts formed on said first and second diffusion regions for bringing said first and second diffusion regions into contact with said wiring respectively, wherein said first and second diffusion regions are polygonal in shape in plan view, and are wider in a direction orthogonal to the direction of said wiring than along the direction of said wiring, and wherein said contacts have a width longer than a width of the wiring formed on the semiconductor layers of said first and second conduction types, and shorter than a maximum width of said wiring formed above said first and second diffusion regions.

2. An input protection circuit according to claim 1, wherein said first and second diffusion regions are rectangular in shape respectively.

3. An input protection circuit for protecting an internal circuit from electrostatic breakdown, comprising:

an input terminal supplying current to said internal circuit;

a first rectifying device formed of a semiconductor layer of a first conduction type connected with a power supply of one polarity, said first device having a PN junction with a periphery of a first diffusion region;

a second rectifying device formed of a semiconductor layer of a second conduction type different from the first conduction type connected with a power supply of the other polarity, said second device having a PN junction with a periphery of a second diffusion region;

a wiring formed to cross above said first and second diffusion regions in order to connect said first and second rectifying devices to the junction point between said input terminal and said internal circuit; and contacts formed on said first and second diffusion regions for bringing said first and second diffusion regions into contact with said wiring respectively, wherein said first and second diffusion regions are polygonal in shape in plan view, and are wider in a direction orthogonal to the direction of said wiring than along the direction of said wiring, wherein said contacts have a width longer than a width of the wiring formed on the semiconductor layers of said first and second conduction types, wherein said first and second diffusion regions are rectangular in shape respectively, and wherein said first and second diffusion regions have widths of the long and short sides thereof with a ratio of between 5/1 and 15/1.

4. An input protection circuit according to claim 1, further comprising an insulating section interposed between said first and second rectifying devices and said wiring.

5. An input protection circuit for protecting an internal circuit from electrostatic breakdown, comprising:

an input terminal supplying current to said internal circuit;

a first rectifying device formed of a semiconductor layer of a first conduction type connected with a power supply of one polarity, said first device having a PN junction with a periphery of a first diffusion region;

a second rectifying device formed of a semiconductor layer of a second conduction type different from said first conduction type connected with a power supply of another polarity, said second device having a PN junction with the periphery of a second diffusion region;

a wiring formed across the surfaces of said first and second diffusion regions in order to connect said first and second rectifying devices to a junction point between said input terminal and said internal circuit; and contacts formed on said first and second diffusion regions for bringing said first and second diffusion regions into contact with said wiring respectively, wherein said first and second diffusion regions are polygonal in shape in plan view, and are wider in a direction orthogonal to the direction of said wiring than along the direction of said wiring, and wherein said contacts have a width longer than a width of the wiring formed on the semiconductor layers of said first and said second conduction types and shorter than a maximum width of said wiring formed above said first and second diffusion regions, and have the edges of the width thereof located equidistantly from the center along the width of said wiring.

6. An input protection circuit according to claim 5, wherein said first and second diffusion regions are rectangular in shape respectively.

7. An input protection circuit protecting an internal circuit from electrostatic breakdown, comprising:

an input terminal supplying current to said internal circuit;

a first rectifying device formed of a semiconductor layer of a first conduction type connected with a power supply of one polarity, said first device having a PN Junction with a periphery of a first diffusion region;

a second rectifying device formed of a semiconductor layer of a second conduction type different from the first conduction type connected with a power supply of another polarity, said second device having a PN junction with a periphery of a second diffusion region;

a wiring formed across the surfaces of said first and second diffusion regions in order to connect said first and second rectifying devices to a junction point between said input terminal and said internal circuit; and contacts formed on said first and second diffusion regions for bringing said first and second diffusion regions into contact with said wiring respectively, wherein said first and second diffusion regions are polygonal in shape in plan view, and are wider in a direction orthogonal to the direction of said wiring than along the direction of said wiring, wherein said contacts have a width longer than a width of the wiring formed on the semiconductor layers of said first and said second conduction types, and have the edges of the width thereof located equidistantly from the center along the width of said wiring, wherein said first and second diffusion regions are rectangular in shape respectively, and wherein said first and second diffusion regions have widths of the long and short sides thereof with a ratio of between 5/1 and 15/1.

8. An input protection circuit according to claim 5, further comprising an insulating section interposed between said wiring and said first and second rectifying devices.

9. An input protection circuit for protecting an internal circuit from electrostatic breakdown, comprising:

an input terminal supplying current to said internal circuit;

a first rectifying device formed of a semiconductor layer of a first conduction type connected with a power supply of one polarity, said first device having a PN junction with a periphery of a first diffusion region;

a second rectifying device formed of a semiconductor layer of a second conduction type different from the first conduction type connected with a power supply of the other polarity, said second device having a PN junction with a periphery of a second diffusion region;

a wiring formed to cross above said first and second diffusion regions in order to connect said first and second rectifying devices to the junction point between said input terminal and said internal circuit; and contacts formed on said first and second diffusion regions for bringing said first and second diffusion regions into contact with said wiring respectively, wherein said first and second diffusion regions are polygonal in shape in plan view, and are wider in a direction orthogonal to the direction of said wiring than along the direction of said wiring, and wherein said power supply of one polarity is formed above said semiconductor layer of the first conduction type on opposite sides of said wiring and along the periphery of said first diffusion region, and said power supply of the other polarity is formed above said semiconductor layer of the second conduction type on opposite sides of said wiring and along the periphery of said second diffusion region.

* * * * *